(12) United States Patent
Gebeyehu et al.

(10) Patent No.: US 9,093,969 B2
(45) Date of Patent: Jul. 28, 2015

(54) SYSTEMS, CIRCUITS AND METHODS RELATED TO CONTROLLERS FOR RADIO-FREQUENCY POWER AMPLIFIERS

(71) Applicant: SKYWORKS SOLUTIONS, INC., Woburn, MA (US)

(72) Inventors: Netsanet Gebeyehu, San Jose, CA (US); Ying Shi, Saratoga, CA (US); Reza Kasnavi, Solana Beach, CA (US); Onder Oz, Santa Clara, CA (US); Jinghang Feng, Santa Clara, CA (US)

(73) Assignee: Skyworks Solutions, Inc., Woburn, MA (US)

( * ) Notice: Subject to any disclaimer, the term of this patent is extended or adjusted under 35 U.S.C. 154(b) by 43 days.

(21) Appl. No.: 13/967,329

(22) Filed: Aug. 14, 2013

(65) Prior Publication Data
US 2014/0049321 A1 Feb. 20, 2014

Related U.S. Application Data

(60) Provisional application No. 61/683,674, filed on Aug. 15, 2012.

(51) Int. Cl.
*H03F 3/04* (2006.01)
*H03G 3/30* (2006.01)

(52) U.S. Cl.
CPC .............. *H03G 3/30* (2013.01); *H03G 3/3042* (2013.01); *H03F 2200/528* (2013.01)

(58) Field of Classification Search
CPC  H03F 2200/522; H03F 3/04; H03F 2200/528
USPC ................................. 330/285, 289
See application file for complete search history.

(56) References Cited

U.S. PATENT DOCUMENTS

| 4,458,201 A * | 7/1984 | Koen ........................... 323/317 |
| 5,378,922 A | 1/1995 | Sovero |

(Continued)

FOREIGN PATENT DOCUMENTS

| JP | 2010-263405 A | 11/2010 |
| KR | 10-2010-0042243 A | 4/2010 |
| WO | WO 2012/061632 | 5/2012 |

OTHER PUBLICATIONS

International Search Report and Written Opinion issued on Nov. 27, 2013 in connection with corresponding PCT Application No. PCT/US2013/055014.

*Primary Examiner* — Steven J Mottola
(74) *Attorney, Agent, or Firm* — Fernando Hale & Chang LLP

(57) ABSTRACT

Disclosed are systems, circuits and methods related to controlling of a radio-frequency (RF) power amplifier (PA). In some embodiments, a PA control circuit can include a first circuit configured to generate a replica base current from a base current provided to the PA, with the replica base current being representative of a collector current of the PA scaled by a beta parameter. The PA control circuit can further include a second circuit configured to generate a beta-tracking reference current from a temperature-compensated voltage and a base resistance associated with the PA. The PA control circuit can further include a current steering circuit configured to receive the replica base current and the beta-tracking reference current and generate a proportional current to a clamping node of a base driver. In some embodiments, the replica base current can be obtained by a current-mode comparison of a finger-sensed current with a ramp current.

20 Claims, 12 Drawing Sheets

(56) References Cited

U.S. PATENT DOCUMENTS

| | | |
|---|---|---|
| 6,734,729 B1 | 5/2004 | Andrys et al. |
| 6,906,359 B2 | 6/2005 | Zampardi et al. |
| 2006/0197594 A1 | 9/2006 | Scuderi et al. |
| 2010/0321096 A1 | 12/2010 | Sudjian |
| 2011/0298538 A1 | 12/2011 | Andrys et al. |

* cited by examiner

SYSTEMS, CIRCUITS AND METHODS RELATED TO CONTROLLERS FOR RADIO-FREQUENCY POWER AMPLIFIERS

CROSS-REFERENCE TO RELATED APPLICATIONS

This application claims priority to U.S. Provisional Application No. 61/683,674 filed Aug. 15, 2012 and entitled "CLAMPING CIRCUITS AND METHODS BASED ON BETA-TRACKING TEMPERATURE-COMPENSATED BASE CURRENT," which is expressly incorporated by reference herein in its entirety.

BACKGROUND

1. Field

The present disclosure generally relates to circuits and methods for controlling radio-frequency (RF) amplifiers, and more particularly, to clamping circuits and methods for such RF amplifiers.

2. Description of the Related Art

In wireless devices such as cellular phones, different components such as a power amplifier (PA) draw current from a battery which typically has a limited capacity. Such a PA can also generate heat if not controlled properly. Thus, it is desirable to have the PA provided with a limited current, so that the current drawn from the battery does not exceed some specified current limit, while maintaining the performance of the PA.

SUMMARY

In accordance with a number of implementations, the present disclosure relates to a radio-frequency power amplifier control circuit. The control circuit includes a first circuit configured to generate a replica base current from a base current provided to a power amplifier (PA), with the replica base current being representative of a collector current of the PA scaled by a beta parameter. The control circuit further includes a second circuit configured to generate a beta-tracking reference current from a temperature-compensated voltage and a base resistance associated with the PA. The control circuit further includes a current steering circuit configured to receive the replica base current and the beta-tracking reference current and generate a proportional current.

In some embodiments, the temperature-compensated voltage can include a temperature-compensated bandgap voltage.

In some embodiments, the current steering circuit can be configured to generate the proportional current under a selected condition based on the replica base current and the beta-tracking reference current. The control circuit can further include a PA base driver in communication with the current steering circuit to receive the proportional current. The current steering circuit can be configured to generate the proportional current by comparing a replica base voltage corresponding to the replica base current and a beta-tracking reference voltage corresponding to the beta-tracking reference current. Each of the replica base voltage and the beta-tracking reference voltage can be generated by providing the respective current into a matched resistor. The selected condition can include the replica base voltage exceeding the beta-tracking reference voltage.

In some embodiments, the base current can be measured by a finger sensor. The finger sensor can be part of a control loop that is configured to generate an error current based on comparison of the base current and a ramp current. The comparison of the base current and the ramp current can be performed in a current-mode. The error current can be obtained by subtracting the base current from the ramp current. The control loop can further include a trans-impedance amplifier configured to amplify the error current.

In some embodiments, the power amplifier can include a gallium arsenide (GaAs) heterojunction bipolar transistor (HBT) power amplifier.

In some embodiments, the control circuit can further include a pre-charging system configured to pre-charge a selected node of the control circuit. The pre-charging system can include a sensor circuit configured to generate a control signal based on comparison of a base voltage of the PA and a reference voltage selected to be lower than a threshold voltage of the PA. The pre-charging system can further include an actuator circuit in communication with the sensor circuit, with the actuator circuit being configured to receive the control signal from the sensor circuit. The actuator circuit can be further configured to enable or disable, based on the control signal, a pre-charge current for pre-charging the selected node of the control circuit.

In some implementations, the present disclosure relates to a method for controlling a radio-frequency power amplifier. The method includes generating a replica base current from a base current provided to a power amplifier (PA), with the replica base current representative of a collector current of the PA scaled by a beta parameter. The method further includes generating a beta-tracking reference current from a temperature-compensated voltage and a base resistance associated with the PA. The method further includes generating a proportional current based on the replica base current and the beta-tracking reference current.

In some embodiments, the method can further include providing the proportional current to a clamping node of a PA base driver under a selected condition.

According to a number of implementations, the present disclosure relates to a radio-frequency (RF) module. The RF module includes a packaging substrate configured to receive a plurality of components. The RF module further includes a power amplifier (PA) disposed over the packaging substrate. The RF module further includes a control circuit disposed over the packaging substrate and interconnected to the power amplifier. The control circuit includes a first circuit configured to generate a replica base current from a base current provided to the PA, with the replica base current being representative of a collector current of the PA scaled by a beta parameter. The control circuit further includes a second circuit configured to generate a beta-tracking reference current from a temperature-compensated voltage and a base resistance associated with the PA. The control circuit further includes a current steering circuit configured to generate a proportional current based on the replica base current and the beta-tracking reference current. The RF module further includes a plurality of connectors configured to provide electrical connections between the power amplifier, the control circuit, and the packaging substrate.

In some embodiments, the power amplifier can be disposed on a first die and the control circuit can be disposed on a second die, with each of the first die and the second die being mounted on the packaging substrate.

According to some teachings, the present disclosure relates to a radio-frequency (RF) device. The RF device includes a transceiver configured to generate an RF signal. The RF device further includes a power amplifier (PA) in communication with the transceiver, with the PA configured to amplify the RF signal. The RF device further includes a control circuit in communication with the PA. The control circuit includes a first circuit configured to generate a replica base current from a base current provided to the PA, with the replica base current being representative of a collector current of the PA scaled by a beta parameter. The control circuit further includes a second circuit configured to generate a beta-tracking reference current from a temperature-compensated voltage and a base resistance associated with the PA. The control circuit further includes a current steering circuit configured to generate a proportional current based on the replica base current and the beta-tracking reference current. The RF device further includes an antenna in communication with the PA, with the antenna being configured to facilitate transmission of the amplified RF signal.

In some embodiments, the RF device can include a wireless device such as a cellular phone.

In a number of implementations, the present disclosure relates to a radio-frequency power amplifier control circuit. The control circuit includes a sensor configured to measure a base current of a power amplifier and generate a sensed current. The control circuit further includes a sensing node configured to receive a reference current and perform a current-mode operation with the sensed current to yield an error current. The control circuit further includes a control loop configured to generate a control signal based on the error current to adjust an operating parameter of the power amplifier.

In some embodiments, the power amplifier can include a gallium arsenide (GaAs) heterojunction bipolar transistor (HBT) power amplifier. The GaAs HBT power amplifier can be configured to operate in, for example, GSM/GPRS communication protocols.

In some embodiments, the sensor can include a finger sensor configured to sense the base current of the power amplifier to yield the sensed current. In some embodiments, the current-mode operation can include subtracting the sensed current from the reference current to yield the error current. In some embodiments, the power amplifier control circuit can be substantially free of a sense resistor between the sensor and the sensing node. In some embodiments, the reference current can be obtained from an external analog control voltage. In some embodiments, the sensing node can be configured to be regulated to substantially maintain a voltage that tracks a battery voltage. In some embodiments, the control loop can include a trans-impedance amplifier configured to amplify the error current. In some embodiments, the control loop can include a closed control loop. In some embodiments, the power amplifier control circuit can be substantially free of an external bypass capacitor to thereby reduce cost and size associated with the power amplifier circuit.

In some embodiments, the control circuit can further include a pre-charging system configured to pre-charge a selected node of the control circuit. The pre-charging system can include a sensor circuit configured to generate a control signal based on comparison of a base voltage of the PA and a reference voltage selected to be lower than a threshold voltage of the PA. The pre-charging system can further include an actuator circuit in communication with the sensor circuit, with the actuator circuit being configured to receive the control signal from the sensor circuit. The actuator circuit can be further configured to enable or disable, based on the control signal, a pre-charge current for pre-charging the selected node of the control circuit.

According to some implementations, the present disclosure relates to a method for controlling a radio-frequency power amplifier. The method includes measuring a base current of a power amplifier to generate a sensed current. The method further includes performing a current-mode operation between a reference current and the sensed current to yield an error current. The method further includes generating a control signal based on the error current. The method further includes adjusting an operating parameter of the power amplifier based on the control signal.

In some implementations, the present disclosure relates to a radio-frequency (RF) module. The RF module includes a packaging substrate configured to receive a plurality of components. The RF module further includes a power amplifier disposed over the packaging substrate. The RF module further includes a control circuit disposed over the packaging substrate and interconnected to the power amplifier. The control circuit includes a sensor configured to measure a base current of the power amplifier and generate a sensed current. The control circuit further includes a sensing node configured to receive a reference current and perform a current-mode operation with the sensed current to yield an error current. The control circuit further includes a control loop configured to generate a control signal based on the error current to adjust an operating parameter of the power amplifier. The RF module further includes a plurality of connectors configured to provide electrical connections between the power amplifier, the control circuit, and the packaging substrate.

In some embodiments, the power amplifier can be disposed on a first die and the control circuit can be disposed on a second die, with each of the first die and the second die being mounted on the packaging substrate.

In accordance with a number of implementations, the present disclosure relates to a radio-frequency (RF) device. The RF device includes a transceiver configured to generate an RF signal. The RF device further includes a power amplifier in communication with the transceiver, with the power amplifier being configured to amplify the RF signal. The RF device further includes a control circuit in communication with the power amplifier. The control circuit includes a sensor configured to measure a base current of the power amplifier and generate a sensed current, a sensing node configured to receive a reference current and perform a current-mode operation with the sensed current to yield an error current, and a control loop configured to generate a control signal based on the error current to adjust an operating parameter of the power amplifier. The RF device further includes an antenna in communication with the power amplifier, with the antenna being configured to facilitate transmission of the amplified RF signal.

In some embodiments, the RF device can include a wireless device. Such a wireless device can be configured to operate as, for example, a GSM/GPRS communication device.

In some implementations, the present disclosure relates to a pre-charging system for a radio-frequency power amplifier control circuit. The pre-charging system includes a sensor circuit configured to generate a control signal based on comparison of a base voltage of a power amplifier (PA) and a reference voltage selected to be lower than a threshold voltage of the PA. The pre-charging system further includes an actuator circuit in communication with the sensor circuit, with the actuator circuit being configured to receive the control signal from the sensor circuit. The actuator circuit is further configured to enable or disable, based on the control signal, a pre-charge current for pre-charging a selected node of the PA control circuit.

In some embodiments, the sensor circuit can include an op-amp comparator configured to receive the base voltage and the reference voltage as inputs and generate the control signal as an output.

In some embodiments, the actuator circuit can include a switch configured to be in an ON state or an OFF state based on the control signal to thereby control the enabling or disabling of the pre-charge current. The switch being in the ON state can disable the pre-charge current by shunting the pre-charge current to ground. The switch being in the OFF state can enable the pre-charge current to be accumulated in a dominant pole capacitance.

In some embodiments, the power amplifier control circuit can include a control loop. The control loop can include a dynamic dominant pole circuit configured to generate different dominant poles, with the dynamic dominant pole circuit including the dominant pole capacitance and a variable dominant pole resistance. The dynamic dominant pole circuit can be configured to generate a first dominant pole by having a first dominant pole resistance and the dominant pole capacitance, or a second dominant pole by having a second dominant pole resistance and the dominant pole capacitance. The first dominant pole resistance can be higher than the second dominant pole resistance. The first dominant pole resistance can be selected to yield a first time constant that facilitates a stable loop and noise reduction in the control loop, and the second dominant pole resistance can be selected to yield a second time constant that facilitates a fast lock in the control loop.

In some embodiments, the control loop can include a base current sensor configured to measure a base current of the PA, and a sensing node configured to receive the measured base current and a reference current and perform a current-mode operation to generate an error current. The control loop can further include a trans-impedance amplifier configured to amplify the error current to generate an amplified signal provided to the dynamic dominant pole circuit. The base current sensor can include a finger sensor configured to sense the base current.

According to a number of implementations, the present disclosure relates to a method for controlling a radio-frequency power amplifier. The method includes comparing a base voltage of a power amplifier (PA) and a reference voltage selected to be lower than a threshold voltage of the PA. The method further includes generating a control signal based on the comparison. The method further includes enabling or disabling, based on the control signal, a pre-charge current for pre-charging a selected node of the PA control circuit.

In a number of implementations, the present disclosure relates to a radio-frequency (RF) module. The RF module includes a packaging substrate configured to receive a plurality of components. The RF module further includes a power amplifier (PA) disposed over the packaging substrate. The RF module further includes a PA control circuit disposed over the packaging substrate and interconnected to the PA. The PA control circuit includes a pre-charging system. The pre-charging system includes a sensor circuit configured to generate a control signal based on comparison of a base voltage of the PA and a reference voltage selected to be lower than a threshold voltage of the PA. The pre-charging system further includes an actuator circuit in communication with the sensor circuit, with the actuator circuit being configured to receive the control signal from the sensor circuit. The actuator circuit is further configured to enable or disable, based on the control signal, a pre-charge current for pre-charging a selected node of the PA control circuit. RF module further includes a plurality of connectors configured to provide electrical connections between the power amplifier, the control circuit, and the packaging substrate.

In some implementations, the present disclosure relates to a radio-frequency (RF) device. The RF device includes a transceiver configured to generate an RF signal. The RF device further includes a power amplifier (PA) in communication with the transceiver, with the PA being configured to amplify the RF signal. The RF device further includes a PA control circuit in communication with the PA. The PA control circuit includes a pre-charging system. The pre-charging system includes a sensor circuit configured to generate a control signal based on comparison of a base voltage of the PA and a reference voltage selected to be lower than a threshold voltage of the PA. The pre-charging system further includes an actuator circuit in communication with the sensor circuit, with the actuator circuit being configured to receive the control signal from the sensor circuit. The actuator circuit is further configured to enable or disable, based on the control signal, a pre-charge current for pre-charging a selected node of the PA control circuit. The RF device further includes an antenna in communication with the PA, with the antenna being configured to facilitate transmission of the amplified RF signal.

In some embodiments, the RF device can include a wireless device. Such a wireless device can be configured to operate as, for example, a GSM/GPRS communication device.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

DETAILED DESCRIPTION OF SOME EMBODIMENTS

Figure 1:
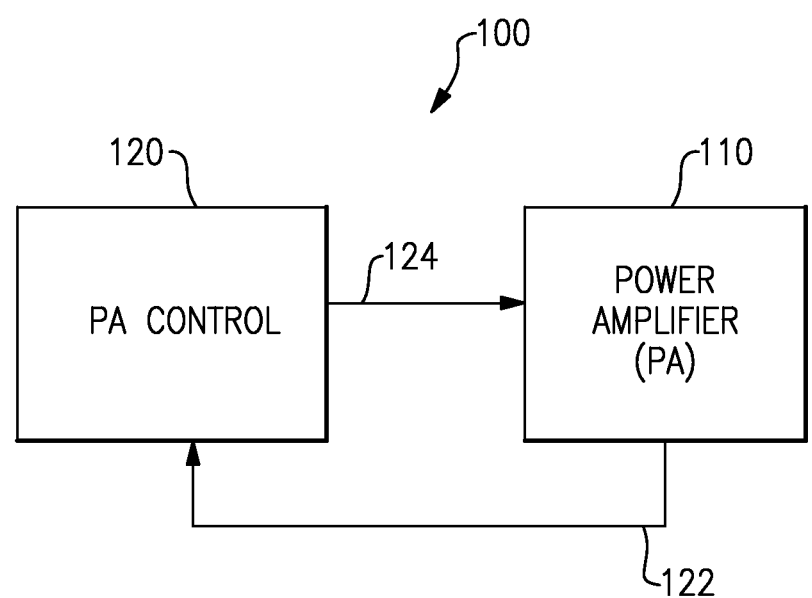
FIG. 1 schematically shows a power amplifier (PA) being controlled by a controller.

The headings provided herein, if any, are for convenience only and do not necessarily affect the scope or meaning of the claimed invention.

In radio-frequency (RF) applications such as wireless power amplifiers (PAs), a current drawn from a power source such as a battery is typically monitored and clamped so as to not exceed a specified value to, for example, ensure device reliability, prevent excessive heat generation, and prolong battery life. It is desirable to have a current-limiting technique implemented to ensure that the current drawn from the battery does not exceed the specified current limit (e.g., maximum current limit) while simultaneously not limiting or degrading other performance metrics such as total radiated power (TRP) and switching transient requirements in normal operation (e.g., voltage standing wave ratio (VSWR) of 3:1).

In some PA architectures, collector current associated with a PA can be sensed directly to facilitate such clamping functionality. In such PA architectures, clamping can be facilitated by sensing the collector current through a small resistance (e.g., a small resistor) and implementing a clamping circuit that gets triggered by the sensed current value. Another design that utilizes direct sensing of the collector current includes use of dual bond wires in series with the last stage of the PA, and a clamping circuit configured to be triggered based on the sensed current across the bond wire.

There can be drawbacks associated with direct sensing as a way of limiting maximum current drawn by a PA. For example, degradation of efficiency can occur as a resistive sensing element needs to be inserted in series with the PA array. Potential RF corruption of the controller can also occur. In another example, the direct sensing solution can also increase cost as the sensing element typically needs to be a precise resistive element. When a precise sensing element is not employed, the accuracy of the clamping technique is typically not sufficient enough to meet stringent clamping requirements.

In PA architectures that do not directly sense collector current of a PA, it can become problematic to implement a current-limiting configuration to ensure that current drawn from the battery does not exceed a specified amount over extreme conditions. In some of such PA architectures, the base bias voltage of the PA can be clamped to not exceed a specified value without any knowledge of the actual current. The lack of knowledge of the actual current value during operation can make the design of the base bias voltage-based clamp complicated and, more importantly, not effective at limiting current to specified value in all conditions. An important weakness of the base bias voltage-based clamping solution can arise from the fact that beta variation of the transistor (e.g., bipolar junction transistor (BJT)) devices (of the PA) over process and/or temperature is not taken into account. Accordingly, such a clamping design generally proves to be ineffective in limiting current over all conditions.

Disclosed herein are circuits, systems, devices and methods related to controlling radio-frequency (RF) power amplifiers (PAs). FIG. 1 shows a PA control configuration 100 where a PA 110 is in communication (e.g., arrows 122, 124) with a PA control component 120. In some implementations, such communication can include a feedback loop where one or more operating parameters associated with the PA 110 is sensed, and based on such sensing, generating a PA control signal to improve the performance of the PA 110. As described herein, the PA control configuration 100 can include clamping functionalities that can address some or all of the foregoing problems.

For the purpose of description herein, a beta parameter $\beta$ can include a ratio between the collector current Icollector and base current Ibase, so that $$\beta = I\text{collector}/I\text{base}. \quad (1)$$

The foregoing relationship in Equation 1 has been shown with experimental data to generally hold even in extreme conditions that include extreme load mismatch (e.g., VSWR 12:1) and other operating conditions such as temperature and supply voltages.

In some implementations, a current clamp architecture can be configured to indirectly sense the current drawn by a PA by utilizing the foregoing beta parameter relationship. In some implementations, such an indirect sensing technique in conjunction with a technique of generating beta-tracking and temperature-compensated reference current can provide a way to monitor and/or limit the maximum current drawn by the PA to a specified value over some or all of operating conditions.

As described herein, a combination that includes some or all of the following can be utilized to clamp a base bias voltage in an effective and accurate manner: (i) relationship between the DC collector current and base current of a PA as given in Equation 1; (ii) a replica of the base current at the base of the PA; and (iii) a reference current that tracks the variation of beta over process and/or temperature.

Figure 2:
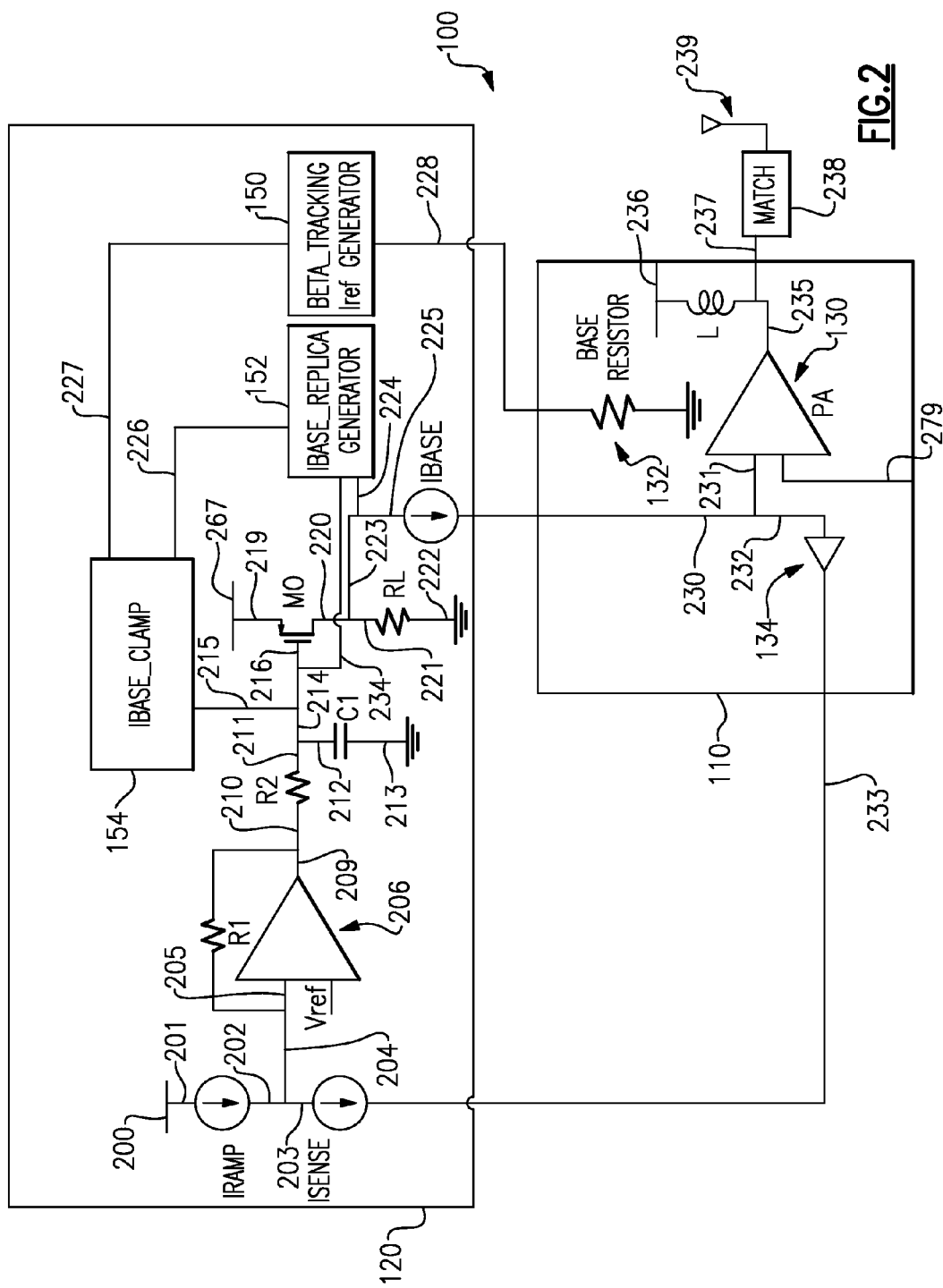
FIG. 2 shows a more detailed example of the PA control configuration of FIG. 1.

FIG. 2 shows an example PA control configuration 100 that can be configured to include a clamping architecture having one or more features as described herein. Although described in the example context of a heterojunction bipolar transistor (HBT) based PA, it will be understood that one or more features of the present disclosure can also be implemented in PAs that are based on other types of transistors. Also, although described in the example context of a finger-based power amplifier controller (FB-PAC), it will be understood that one or more features of the present disclosure can be implemented in other types of PA controllers.

The example configuration 100 is shown to include a PA 110 coupled to a PA controller 120. The PA controller 120 can include a replica base current generator 152 ("Ibase_replica Generator" in FIG. 2) that is configured to produce a scaled or unscaled version of the base current being provided to (through path 225) and consumed by the PA 110. This replica base current can be taken to be the PA collector current scaled by its beta.

The PA controller 120 can further include a beta-tracking reference current generator 150 ("beta_tracking Iref Generator" in FIG. 2) that is configured to generate a beta-tracking reference current by providing a temperature-compensated bandgap voltage (through path 228) on to a base resistance (e.g., a base resistor) 132 on the PA 110. The base resistor 132 can be configured to track the beta of the BJT process used in the PA design. In some embodiments, the base resistor 132 can be fabricated from the same layer as the base layer of an HBT stack, and can have similar characteristic as the base of the BJT devices.

In some embodiments, the base resistor 132 can be configured to generally track beta inversely over temperature. Thus, the voltage provided to the base resistor 132 can be temperature-compensated in such a way that the resulting reference current can be made to track beta over process and temperature.

The replica base current and the beta-tracking reference current generated in the foregoing examples can be utilized to generate a replica base voltage and beta-tracking reference voltage, respectively. For example, replica base current and the beta-tracking reference current can be provided to a matched resistance (e.g., a matched resistor) to generate the replica base voltage and the beta-tracking reference voltage, respectively.

A differential current steering circuit 154 ("Ibase_clamp" in FIG. 2) can be configured to receive (e.g., through paths 226, 227) and compare (e.g., substantially continuously) the replica base voltage against the beta-tracking temperature-compensated reference voltage, and steer a proportional current to ground or a clamping node of a PA base driver. In some implementations, a clamping current can be steered into the clamping node of the PA base driver to clamp the PA base bias voltage if the replica base voltage exceeds the beta-tracking reference voltage. Additional examples concerning differential current steering circuit 154 are described herein in greater detail.

In FIG. 2, the example PA 110 is shown to include an amplifying element 130 (e.g., an HBT) that receives the base current Ibase from the PA controller 120, through paths 225, 230 and 231. The base of the HBT 130 can also receive an RF signal to be amplified (through path 279). The amplified RF signal is shown to be output from the HBT 130 (e.g., through the collector) through path 235. The amplified RF signal can then be provided (through path 237) to a matching circuit 238, a switching circuit (not shown), and then to an antenna 239 for transmission.

In the example PA 110, the supply current (Icollector) being provided to the collector of the HBT 130 from a supply node 236 can be passed through, for example, a choke inductance L.

FIG. 2 shows that in some embodiments, paths 225, 230 that provide the base current Ibase from the PA controller 120 to the PA 110 can be part of a control loop. For example, the base current Ibase provided to the base of the HBT 130 can also be provided to a sensor 134 such as a finger sensor, through path 232. Examples of such a sensor are described herein in greater detail.

An output of the sensor 134 (at paths 233, 203) in a current form (Isense) is shown to be combined with a ramp current (Iramp at path 202), and the combination (e.g., by direct subtraction of Isense from (ramp), still in a current form, can be amplified by, for example, a trans-impedance amplifier (TIA) 206. A resistance R1 across the TIA 206 can be selected to set a gain of the foregoing control loop involving the sensor 134. Examples concerning the foregoing current-domain operation of the sensed current Isense, as well as maintaining a reference voltage (Vref) at the sensing node (where (ramp and Isense meet), are described herein in greater detail.

The output of the TIA 206 is shown to be provided to path 209 and be coupled with the differential current steering circuit 154 (through paths 210, resistance R2, paths 211, 124, 215). The resulting voltage at node 214 combined with the output of the differential current steering circuit 154 can be provided to a FET (e.g., a MOSFET) M0 (through path 216) for generating a replica base current. The same voltage at path 216 is also shown to be provided to the replica base current generator 152 through path 234. The output of the TIA 206 is also shown to be coupled to ground at a node after R2, through path 210, capacitance C1, and path 213. It is noted that from a controller point of view, the signal of interest at the node (where paths 214, 215 and 216 meet) is a voltage which gets translated to base voltage that drives the PA. However, from a current clamp point of view, the current steering circuit pushes current into the TIA output (209) and to this node, which results in developing voltage that overrides the controller voltage and therefore results in holding the base voltage of PA at a "clamped" voltage.

The transistor M0 is shown to receive the comparator-output voltage at its gate (through path 216). The source of M0 is shown to be connected (through path 219) to a supply node 267, and the drain of M0 is shown to be connected (through path 220) to a load resistance RL which is in turn grounded (through path 222). The drain of M0 is also shown to be coupled to the replica base current generator 152 through path 220, 223 and 224.

As described herein, the collector current of the PA can be indirectly sensed, and compared against a beta-tracking temperature-compensated reference current. Based on such a comparison, the PA base bias voltage can be clamped so that the total current drawn from a battery does not exceed a specified value in various environmental and device operation conditions.

Figure 3:
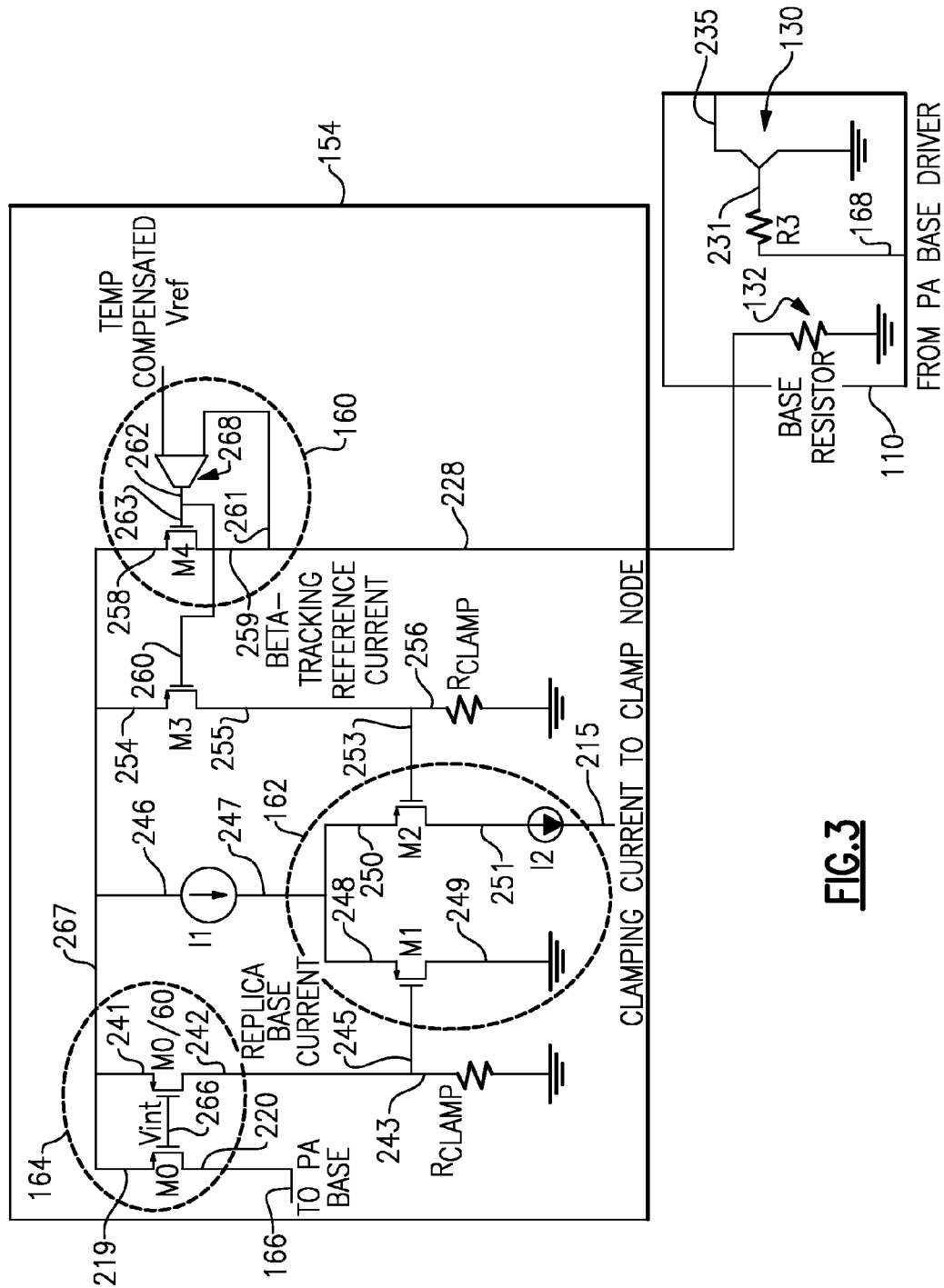
FIG. 3 shows additional details of some of the components of the controller of FIG. 2.

FIG. 3 shows an example of how the differential current steering circuit 154 described in reference to FIG. 2 can be configured. A circuit generally indicated as 160 can provide some or all of the functionalities associated with the beta-tracking reference current generator 150 of FIG. 2. For example, a reference current that tracks the beta parameter and is temperature-compensated is shown to be generated by the circuit 160. More particularly, a reference current from a reference node 267 (through path 258) is shown to be passed through a transistor (e.g., a MOSFET) M4 to yield a current in path 259 that is provided to the base resistance 132 of the PA 110. Because the base resistance 132 can track the beta of the HBT 130, the reference current in path 228 can be a beta-tracking reference current.

As shown in FIG. 3, a temperature-compensation feature and the foregoing beta-tracking feature can be combined to yield a temperature-compensated beta-tracking reference voltage. For example, a proportional-to-absolute-temperature (PTAT) current from a bandgap circuit can be used to generate a temperature-compensated reference voltage (Vref) at an input of the circuit 160. Then, this temperature-compensated reference voltage can be dropped across the beta-tracking base resistance 132 of the PA 110. Thus, Vref, which is a function of temperature and base resistance (Rb, which is a function of both temperature and beta) can be used to generate the reference current as given by (Vref(temp)/Rb (beta,temp)). Hence, such a reference current is both temperature compensated and beta-tracking.

The output of the circuit 160 is shown to be provided to the gate of a transistor (e.g., a MOSFET) M3 (through path 260) so as to control the flow of the reference current from the reference node 267 (through path 254). M3 and M4 can be configured substantially similarly such that the current exiting M3 in path 255 is a replica of the temperature-compensated beta-tracking reference current in path 228. As described herein, such a reference current can be compared against a replica base current by the circuit generally indicated as 162.

In FIG. 3, the foregoing replica base current can be provided to path 242 by the circuit generally indicated as 164. The example circuit 164 is shown to be implemented as a scaled current mirror configuration, where a reference current from the reference node 267 passes through each of a first transistor (e.g., a MOSFET) M0 and a second transistor (e.g., a MOSFET) M0/60. Each of the gates of M0 and M0/60 is provided with a voltage Vint (at node 266), which can be a finger-sensor-compensated reference voltage at path 216 (FIG. 2). In the example scaled current mirror, the second MOSFET M0/60 is configured to yield a replica base current at path 242 that is scaled from the current in path 166 by a factor of 60. It will be understood that other scale factor values can also be utilized.

As shown in FIG. 3, the reference current from M0 is shown to be provided to the base of an HBT 130 of the PA 110 through paths 166 and 168, resistance R3, and path 231.

In FIG. 3, a circuit generally indicated as 162 can provide some or all of the functionalities associated with the differential current steering circuit 154 of FIG. 2. The example steering circuit 154 is shown to include transistors (e.g., MOSFETs) M1 and M2, with their sources receiving the reference current I1 from the reference node 267 (through common paths 246, 247, and path 248 for M1, and path 250 for M2). The drain of M1 is shown to be coupled to ground (through path 249); and the drain of M2 is shown to provide a clamping current I2 to a clamp node (through paths 251, 215). In some embodiments, M1 and M2 can be substantially similar so as to allow steering of the reference current I1 based on comparison of voltages corresponding to the beta-tracking temperature-compensated reference current in path 255 and the replica base current in path 242.

The beta-tracking temperature-compensated reference voltage can be generated by providing the beta-tracking temperature-compensated reference current to a clamp resistance (Rclamp) through path 256. Similarly, the replica base voltage can be generated by providing the replica base current to a clamp resistance (Rclamp) through path 243. In some embodiments, the clamp resistances at their respective paths 256 and 243 can be substantially similar so as to allow the foregoing comparison of the voltages.

The foregoing beta-tracking temperature-compensated reference voltage is shown to be provided to the gate of M2 (through path 245). Similarly, the foregoing replica base voltage is shown to be provided to the gate of M1 (through path 253). Based on such a configuration, the differential current steering circuit 162 can compare the foregoing voltages and steer proportional current to the ground or the clamping node of a PA base driver.

Figure 4:
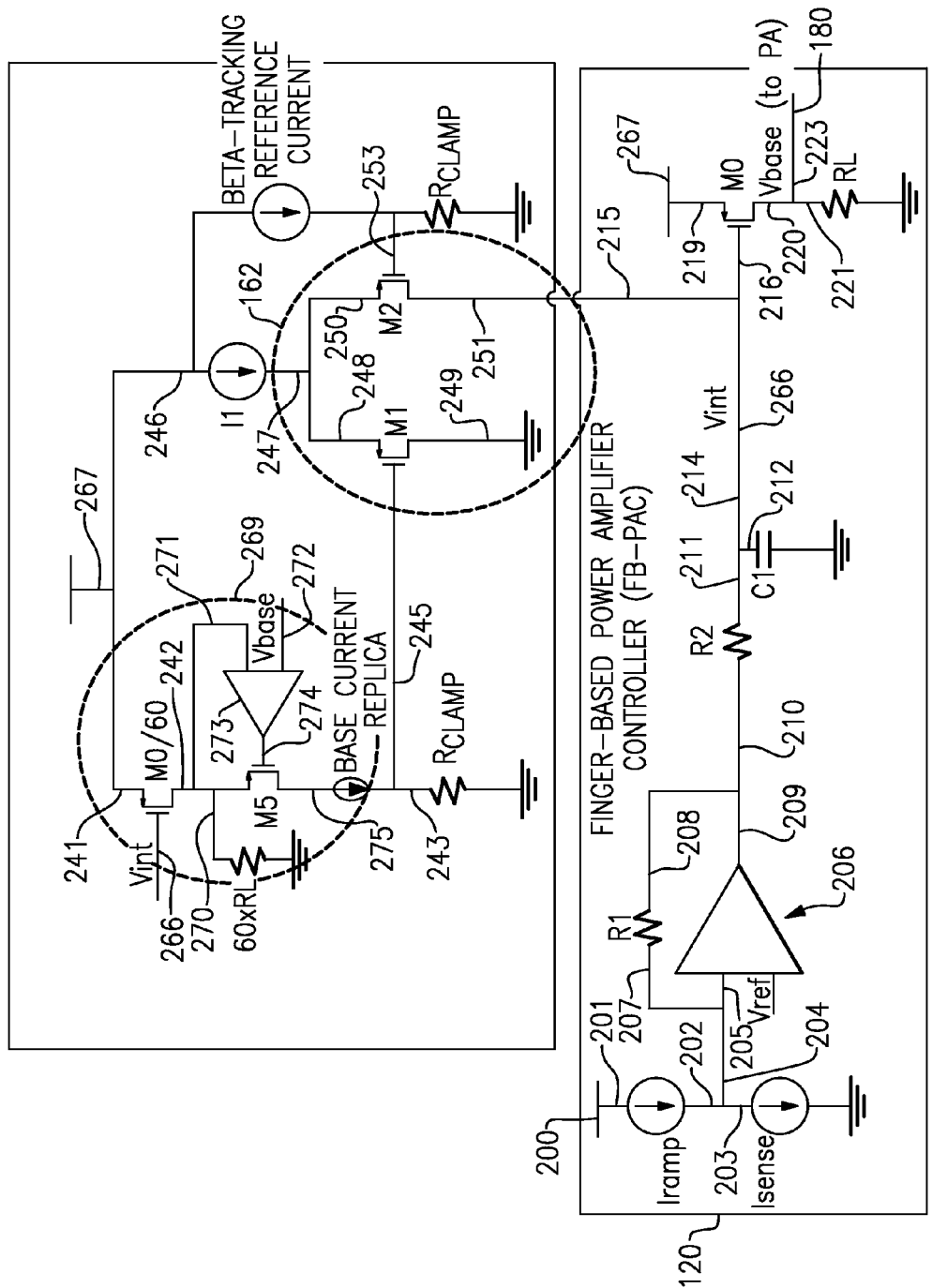
FIG. 4 shows additional details of a clamping circuit being controlled at least in part by the controller of FIG. 2.

FIG. 4 shows an example of the foregoing base driver that can be implemented as a part of a finger-based power amplifier controller (FB-PAC) 120. The current provided to the clamping node from the current steering circuit 162 (through path 215) is shown to facilitate generation of the base bias voltage Vbase by the FB-PAC 120 and provided to the PA through a path indicated as 180. For example, the current provided by the current steering circuit 162 (through path 215) can be combined with the output of the op-amp 206 passed through resistance R2 to yield the voltage Vint at the clamping node 266. The circuit associated with the op-amp 206 and related components can be implemented as described herein in reference to FIG. 2.

In FIG. 4, a circuit generally indicated as 269 shows an example of how the replica base current can be generated from the drain of the scaling transistor M0/60. As described herein, the source of M0/60 can be coupled to the supply node 267 (through path 241), and the gate of M0/60 can be provided with Vint of the clamping node 266 so as to control the flow of the reference current. The current from the drain of M0/60 can be passed through a transistor (e.g., a MOSFET) M5. The gate of M5 can be provided with an output of an op-amp 273 (through path 274) that amplifies the output of M0/60 (through path 271). The op-amp 273 is also shown to be supplied with the base bias voltage Vbase. The output of M0/60 provided to the op-amp 273 can be converted into a voltage by a resistance of 60×RL (through path 270). The resulting current at the drain of M5 at path 275 is shown to be utilized as the replica base current as described herein.

In some PA control configurations for cellular applications such as GSM/GPRS, a large regulator may be required; and such a regulator can be costly and can impact power added efficiency (PAE). Some PA control systems can be configured to eliminate the need for such a large regulator, to thereby reduce cost and improve PAE. However, sensitivities to RF corruption and DC offset can still present challenges. In addition, switching transient (SWT) and power-vs-time (PvT) degradation into voltage standing wave ratio (VSWR) and lack of total radiated power (TRP) performance can also suffer.

Some solutions that address the foregoing issues can involve high costs that prevent widespread adoption for the general GSM/GPRS market. Also, in the example context of GaAs process, some GaAs PA controls can be hindered by limitations associated with, for example, GaAs HBT (heterojunction bipolar transistor) process. For example, such limitations can include lack of trimming capability, which is typically required in some PA control circuits.

Some desirable features associated with PAs can include lower cost enabled by architecture, superior performance including PAE and TRP, improved robustness and easy-of-use (e.g., an architecture desirably should address sensitivity to RF corruption and DC offset, and achieve robust SWT/PvT operation into VSWR), and small module size. Such desirable features can apply to GSM/GPRS and other communication protocols. In the context of the example GSM/GPRS protocol, a PA's power control architecture can play an important role. Such an architecture can have profound impact on cost, performance, robustness and module size. In some situations, it can be one of the most important differentiating factor in commercial GSM/GPRS PA products. Described herein are one or more features that can provide a power control architecture that provides advantages in cost, performance, robustness, size, or any combination thereof. In some implementations, all of such advantageous features can be effectuated by a power control architecture having one or more features described herein.

In some implementations, a power control architecture can include three components: power detection, processing of the detected signal in a controller, and actuation of a control signal generated by the controller. Methods for power detection can include, for example, direct detection and indirection detection. Direct detection typically involves an RF coupler and RF detectors. Indirect detection can take advantage of a relationship between RF power and DC characteristics of a given PA. Many modern GSM/GPRS PAs utilize the indirect detection to reduce cost and size.

The power actuation referred to above typically includes collector voltage control and base current control. Some architectures use a collector voltage of an output stage as a measure of the PA's power. Such an architecture can control the PA power by, for example, regulating the collector voltage through a large low-dropout (LDO). In many situations, the large LDO not only increases cost, but it can also degrade PAE due to the LDO drop-out.

In some PA control architectures, such as an integrated PA control (IPAC), the need for a large LDO can be eliminated, thereby reducing cost and improving PAE. In addition, a PA can operate in current saturation substantially all the time, resulting in improved current consumption at different power levels. In such an IPAC architecture, a detected DC current is immediately converted to voltage through a precision sense resistor. The sense resistor typically needs to be small in value in order to minimize the voltage drop-out across the resistor. While the small voltage signal minimizes the PAE degradation, it can present challenges in the subsequent processing of the signal in the controller, due to the sensitivities to RF corruption and DC offsets of the error amplifier. To address these issues, some IPAC configurations can include significant RF bypassing and trimming circuits.

In some embodiments, the power detection referred to above can include a method where sensing of an output array current is achieved by a sense finger. Such a sense finger can be configured to closely track the output array. The finger current in such a configuration is then converted into small voltage through a sense resistor. The voltage signal is then processed by controller. Additional details concerning the example sense finger can be found in U.S. Pat. No. 6,734,729, entitled "Closed Loop Power Amplifier Control," which is expressly incorporated by reference in its entirety and is to be considered part of the specification of the present application.

In some implementations, the present disclosure relates to a PA control architecture that includes one or more features associated with current-mode control operation. As described herein, such a current-mode PA control can be implemented in conjunction with the foregoing finger-sensing configuration. Although described in such an example sensing configuration, it will be understood that one or more features of the present disclosure can also be implemented in other sensing configurations. It will also be understood that one or more features of the present disclosure can be implemented in other types of PAs (e.g., PAs other than HBT, and/or PAs other than those based on GaAs process technology).

Figure 5:
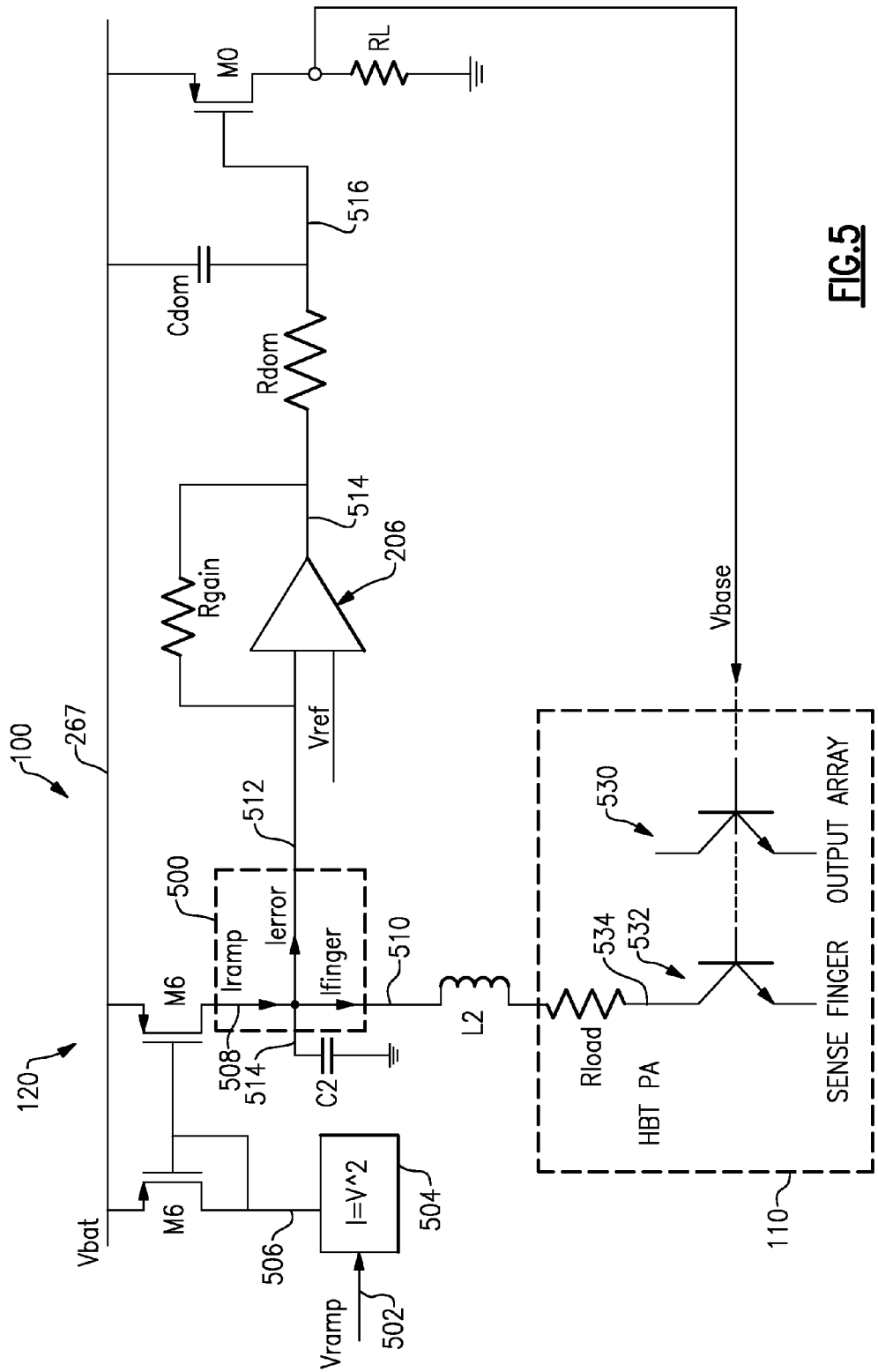
FIG. 5 shows that in some embodiments, the controller of FIG. 2 can be configured to operate in a current-mode.

FIG. 5 shows that in some implementations, a PA control architecture 100 can be based on the foregoing finger-based IPAC power detection method. Such an architecture can be similar to or be a substitute of the control architecture examples described herein in reference to FIGS. 2 and 4.

As described herein, a sense finger 532 (e.g., 1×) in a PA circuit 110 (e.g., an HBT PA) can be implemented to improve accuracy of tracking an output array 530 (e.g., 70×) in DC current. Such a sensing configuration can include the finger 532 and the output array 530 sharing a common DC ballast resistor. The finger 532 can also be placed at a layout location that improves thermal tracking. A loading resistance (Rload) to the finger 532 can be selected with a value that provides compensation of the output power's (Pout) dependency on battery voltage (Vbat), thereby improving power control accuracy across Vbat.

FIG. 5 shows that in some implementations, a finger current (Ifinger) is not converted into voltage. Instead, analog signal processing of the finger current in a PA control circuit 120 can remain in the current domain. The PA control circuit 120 is shown to include a sensing node 500 configured to facilitate such a current mode operation. The sensed finger current (Ifinger) in path 510 (resulting from the output of the sense finger 532 passed through path 534, resistance Rload, and inductance L2) can be directly subtracted from a reference current (Iramp) in path 508. In the examples described in reference to FIGS. 2 and 4, path 510 can be similar to path 203, and path 508 can be similar to path 202.

In some embodiments, the reference current Iramp can be derived from an external analog control voltage (e.g., a Vramp signal in a GSM/EDGE system). The reference current Iramp can be injected to the sensing node 200 through path 508. The sensing node 200 can be regulated to substantially maintain at a voltage (Vsense) that tracks Vbat (e.g., Vsense=Vbat−0.4V).

As further shown in FIG. 5, an error current (Ierror) generated from the sensing node 500 can be provided to (through path 512) and be amplified by a trans-impedance amplifier (TIA) 206. In some embodiments, path 512 and the TIA 206 can be similar to path 204 and the op-amp 206 in FIGS. 2 and 4. A resistance (Rgain, which can be similar to R1 in FIGS. 2 and 4) across the TIA 206 can be selected to set a gain of the example control loop in FIG. 5. An output voltage of the TIA 206 can be provided to an RF filter (e.g., Rdom and Cdom) through path 514, and then to a base driver through path 516. The base driver can include a transistor M0 which can be similar to M0 in FIGS. 2 and 4. The driver's output can be connected to the base of the PA as described herein, thereby closing the control loop.

By processing the sensed signal (e.g., finger-sensed signal) in the current domain as described in the foregoing example, the PA control architecture does not need to rely on a high precision sense resistor and/or a high precision error amplifier that requires trimming. In addition, the current-mode signal processing can be more robust against RF corruption, thereby relaxing the requirement for RF bypassing. For example, a non-current-mode based IPAC or finger-based IPAC can include 3-6 external bypass capacitors to facilitate the power detection and power control functionalities. In comparison, the example current-based sensing and control configuration does not require any external bypass capacitors. In situations where a bypass capacitor is required or desired, such a capacitor can be integrated in a controller die.

In some implementations, the current-mode processing technique as described herein can provide several advantages. Such a technique can eliminate the need for a high precision sense resistor and/or a high precision error amplifier, which in turn can eliminate the need for trimming and allow use of lower cost processes (e.g., a CMOS process) as opposed to more costly processes (e.g., a BiCMOS process). In addition, the current-mode signal processing can significantly improve the robustness against RF corruption, thereby relaxing the requirement for RF bypassing. Accordingly, not requiring components such as external bypass capacitors can result in a reduction in cost and size of a PA control module.

In some wireless applications (e.g., GSM/GPRS), an output power of a power amplifier can be set by an external voltage reference. Once such a reference voltage is applied, it is typically desirable to limit variations in output power that can occur based on factors such as frequency, input power, supply voltage, and temperature.

To accomplish such limit in output power variations, a control system can be utilized. Such a control system can be based on, for example, analog amplitude control loops. Such loops can involve a number of factors. For example, stability of a loop is typically an important factor. To obtain a stable control loop, a dominant pole much below RF frequencies can be established within the loop. Such a dominant pole can also be utilized to prevent excessive out of band noise contribution from control circuitries.

In other design considerations, it is typically desirable to configure a control loop to settle relatively fast before ramping starts, in order to meet, for example, power-vs.-time (PVT) mask and/or switching transient spectrum (SWT) specification. In short, it is typically desirable to have the control loop achieve lock quickly, and then ramp up to its final value during burst.

In order to lock the loop, an initial constant external reference voltage can be applied. Typically, such a reference voltage has low enough power such that it does not violate a given PVT mask. Such a voltage is sometimes referred to as "pedestal" voltage, and the corresponding power is referred to as "pedestal" power. Similarly, a control loop lock time achieved by use of such a pedestal voltage is commonly referred to as pedestal acquisition time or lock acquisition time.

In some implementations, a relatively small dominant pole having a large time-constant can be utilized to establish a stable loop and to remove or reduce noise associated with the control circuit. On other hand, a fast loop lock acquisition is typically achieved with a relatively large dominant pole having a small time-constant. To address such conflicting design considerations, an amplitude lock acquisition can be employed to address the loop stability and fast loop acquisition design goals.

In systems utilizing such techniques, a dynamic dominant pole and pre-charge methods can be employed to speed up loop acquisition. In these systems where loop acquisition is sped up by use of pre-charge and dynamic pole, pre-charge control can play an important role.

In some techniques, a pre-charge system can be controlled with an open loop. In such a system, the loop can be precharged to a sufficiently low value that does not violate design parameters such as PVT mask and forward isolation. Accordingly, such a pre-charge is not fully utilized; and an ideal or desired loop acquisition time may not be obtained. Examples of trade-off between pre-charge duration, PVT mask violation, and loop acquisition time are described herein in greater detail.

Figure 6:
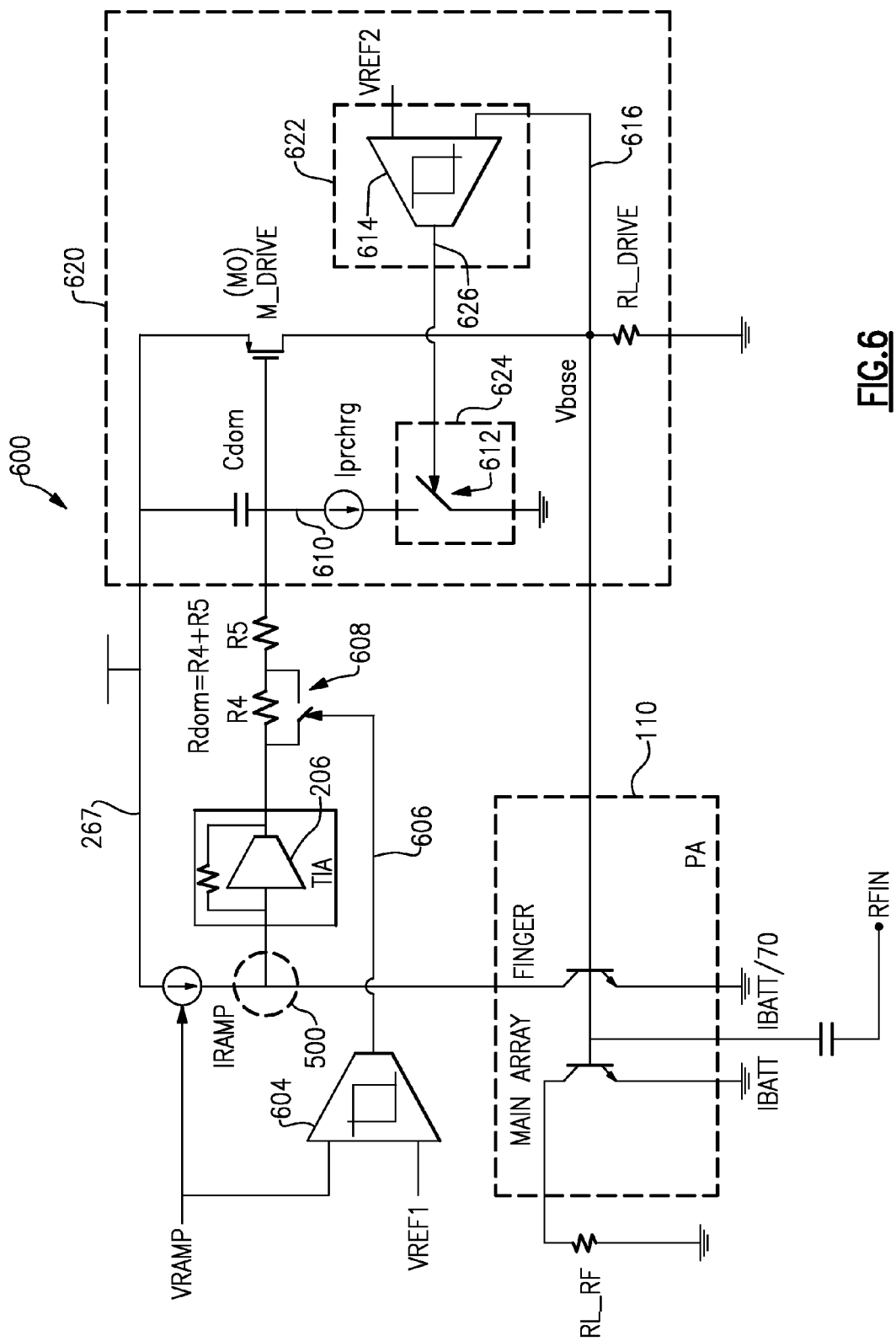
FIG. 6 shows an example of a PA control system having a pre-charging system.

FIG. 6 shows an example control system 600 that includes a pre-charging system 620 which can be configured to provide one or more features as described herein. The pre-charging system 620 can be configured with a feedback that charges a desired node (e.g., Vbase) of a PA control loop during startup to a point (VREF2) just below the PA turn-on threshold so that forward isolation issue and PVT violation are avoided reduced. As a result, the loop acquisition can be sped up significantly.

As shown in FIG. 6, the example pre-charging system 620 can include a sensor circuit 622 and an actuator circuit 624. The sensor circuit 622 can be configured to monitor (e.g., continuously) (through path 616) the base voltage (Vbase) of the PA 110, and compare it against a selected reference voltage (VREF2) that is lower than the PA threshold voltage. In some embodiments, such a comparison can be achieved by, for example, an op-amp comparator 614. Based on the comparison of the monitored Vbase and VREF2, the sensor circuit 622 can generate a control signal at node 626.

In some embodiments, the actuator circuit 624 can be in communication with the sensor circuit 622 through node 626 so as to receive the control signal generated by the sensor circuit 622. Based on the control signal, the actuator circuit 624 can enable or disable a pre-charge current (Iprchrg) that can be utilized to charge up selected node(s) of the PA control loop. In some embodiments, such enabling or disabling of the pre-charge current (Iprchrg) can be achieved by, for example, a switch 612 configured to close or open based on the control signal from the sensor circuit 622. For example, when the switch 612 is closed, the pre-charge current can be disabled. When the switch 612 is open, the pre-charge current can be enabled.

As shown in FIG. 6, the example pre-charging system 620 can further include a dynamic pole capability by adjusting the RC value resulting from Rdom and Cdom. For example, a resistance (Rdom) associated with a dynamic dominant pole can include resistances R4 and R5; and one of R4 and R5 can be bypassed (e.g., by a switch 608) when desired to change the RC value. At low powers, the switch 608 can be closed to short R4, Cdom can be pre-charged to establish good biasing point to speed fast locking loop. When the switch 608 is opened, Rdom can be increased to increase the RC value; and such an increase in time constant can facilitate a stable loop and to remove or reduce noise associated with the control circuit.

In the example of FIG. 6, the switch 608 can be operated by an output of a comparator 604 that compares a reference voltage (VREF1) and a ramp voltage (VRAMP). Also in the example of FIG. 6, other portions of the PA control loop (e.g., a current mode sensing node 500, TIA 206, M0 (M_DRIVE), and finger sensor of the PA 110) can be configured in similar manners as described herein in reference to FIGS. 2-5. Although described in the context of such an example control loop configuration, it will be understood that one or more features associated with the pre-charging system 620 can be implemented in other types of control systems.

The foregoing pre-charging system 620 can be operated to, for example, charge Vbase with a right amount of voltage (e.g., an amount right below PA turn-on threshold) to thereby better utilize pre-charging functionalities. With the foregoing feedback based pre-charging configuration, the loop lock acquisition is obtained very rapidly for the PA control loop without impeding other performance metrics.

Figure 7:
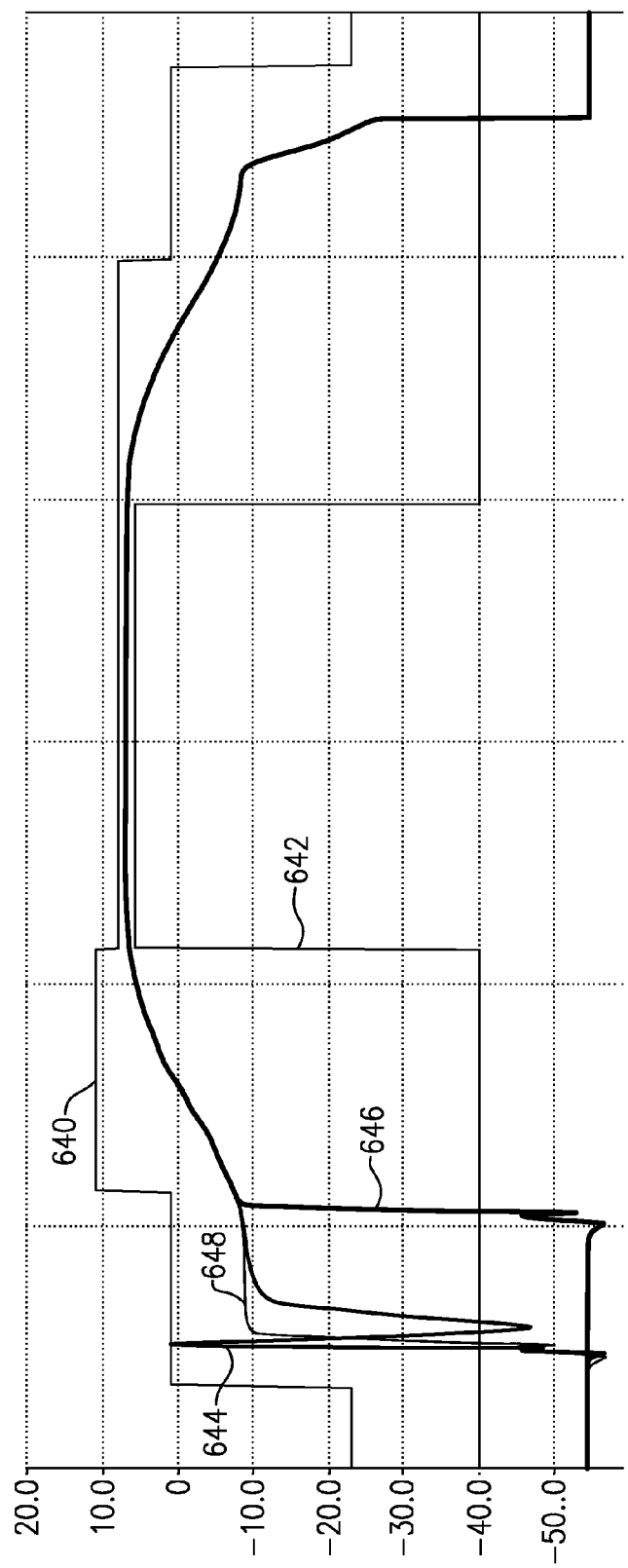
FIG. 7 shows an example of how the pre-charging system of FIG. 6 can provide improved performance in loop lock acquisition associated with the PA control system of FIG. 6.

FIG. 7 shows various plots (as functions of time) obtained by simulation that demonstrate how the pre-charging system 620 can speed up loop acquisition significantly without degrading PVT performance. In FIG. 7, an example PVT mask specification is indicated by an upper boundary 640 and a lower boundary 642. A pre-charging example depicted by curve 644 involves an excessive pre-charge (e.g., in an attempt to speed up loop acquisition) which temporarily exceeds the upper boundary 640 thereby violating the PCT mask specification. To avoid such PVT violation, less precharge can be applied, as shown by curve 646. However, such a reduction in pre-charge lengthens the loop acquisition time which may not meet design specifications.

FIG. 7 further shows a pre-charging curve 648 that can be obtained by use of the pre-charging system 620 of FIG. 6. One can see that both of the PVT mask and loop lock acquisition time specifications are met by such a pre-charging curve. As shown and described herein, such an advantageous feature can result from pre-charging a right amount of Vbase for a right amount of time.

Figure 8:
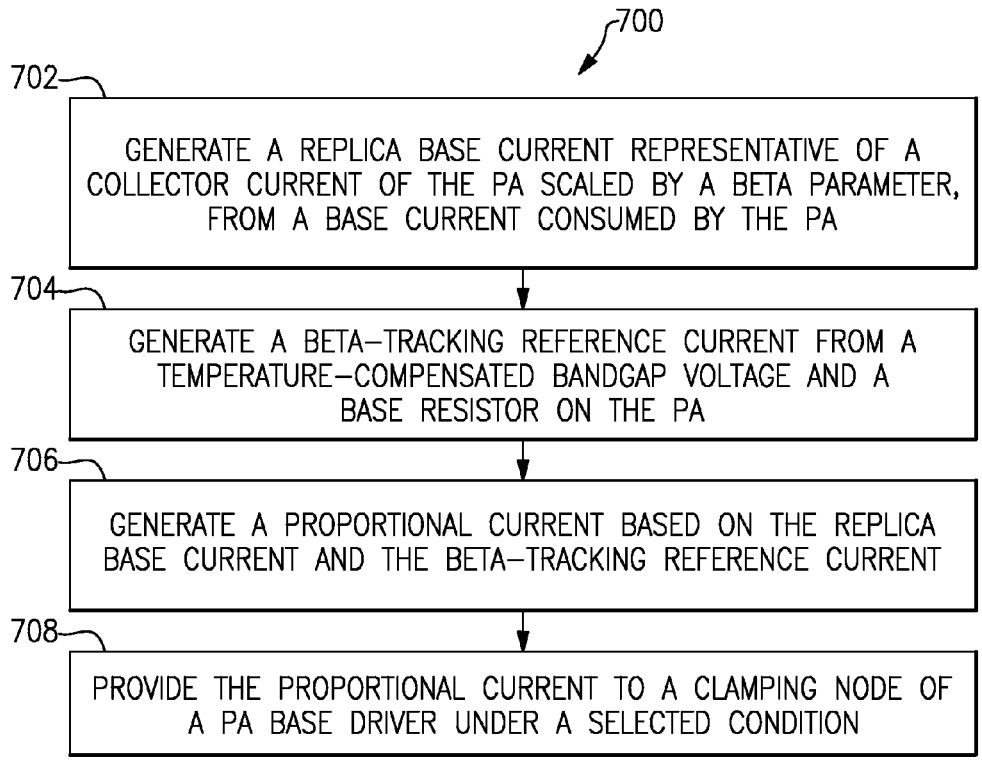
FIG. 8 shows a process that can be implemented to control a PA.

FIG. 8 shows a process 700 that can be implemented to control a power amplifier (PA). In block 702, a replica base current can be generated, where the replica base current is representative of a collector current of the PA scaled by a beta parameter. Such a current can be generated from a base current consumed by the PA. In block 704, a beta-tracking reference current can be generated from a temperature-compensated voltage (e.g., bandgap voltage) and a base resistor on the PA. In block 706, a proportional current can be generated based on the replica base current and the beta-tracking reference current. In block 708, the proportional current can be provided to a clamping node of a PA base driver under a selected condition (e.g., if the replica base current exceeds the beta-tracking reference current).

Figure 9:
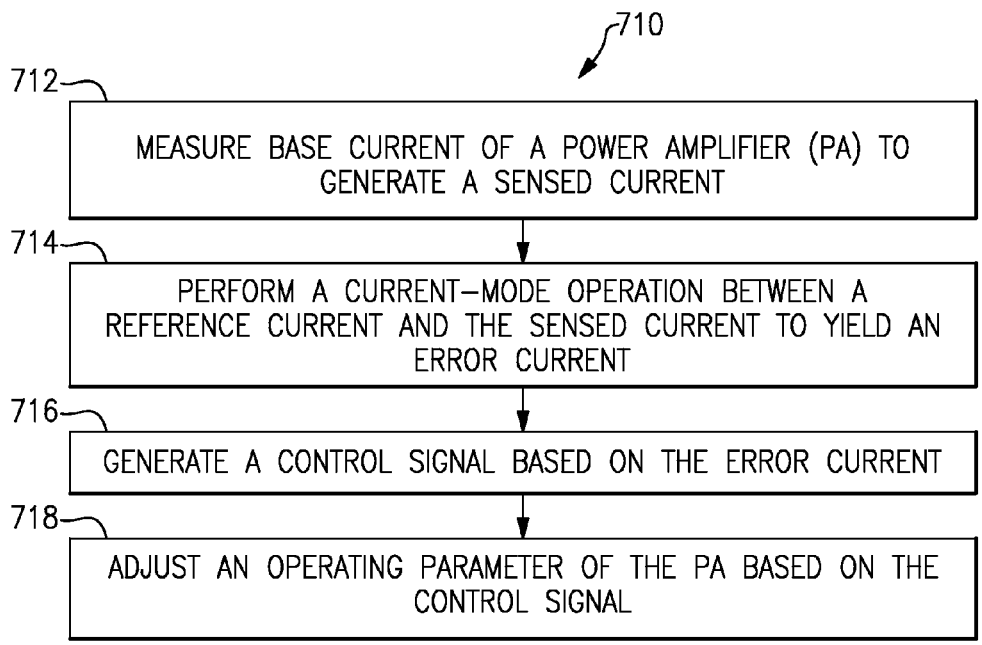
FIG. 9 shows another process that can be implemented to control a PA.

FIG. 9 shows a process 710 that can be implemented to control a power amplifier (PA). In block 712, a base current of the PA can be measured to generate a sensed current. In block 714, a current-mode operation can be performed between a reference current and the sensed current to yield an error current. For example, the sensed current can be subtracted from the reference current to yield the error current. In block 716, a control signal can be generated based on the error current. In block 718, an operating parameter of the PA can be adjusted based on the control signal. For example, the base current can be adjusted based on the control signal.

Figure 10:
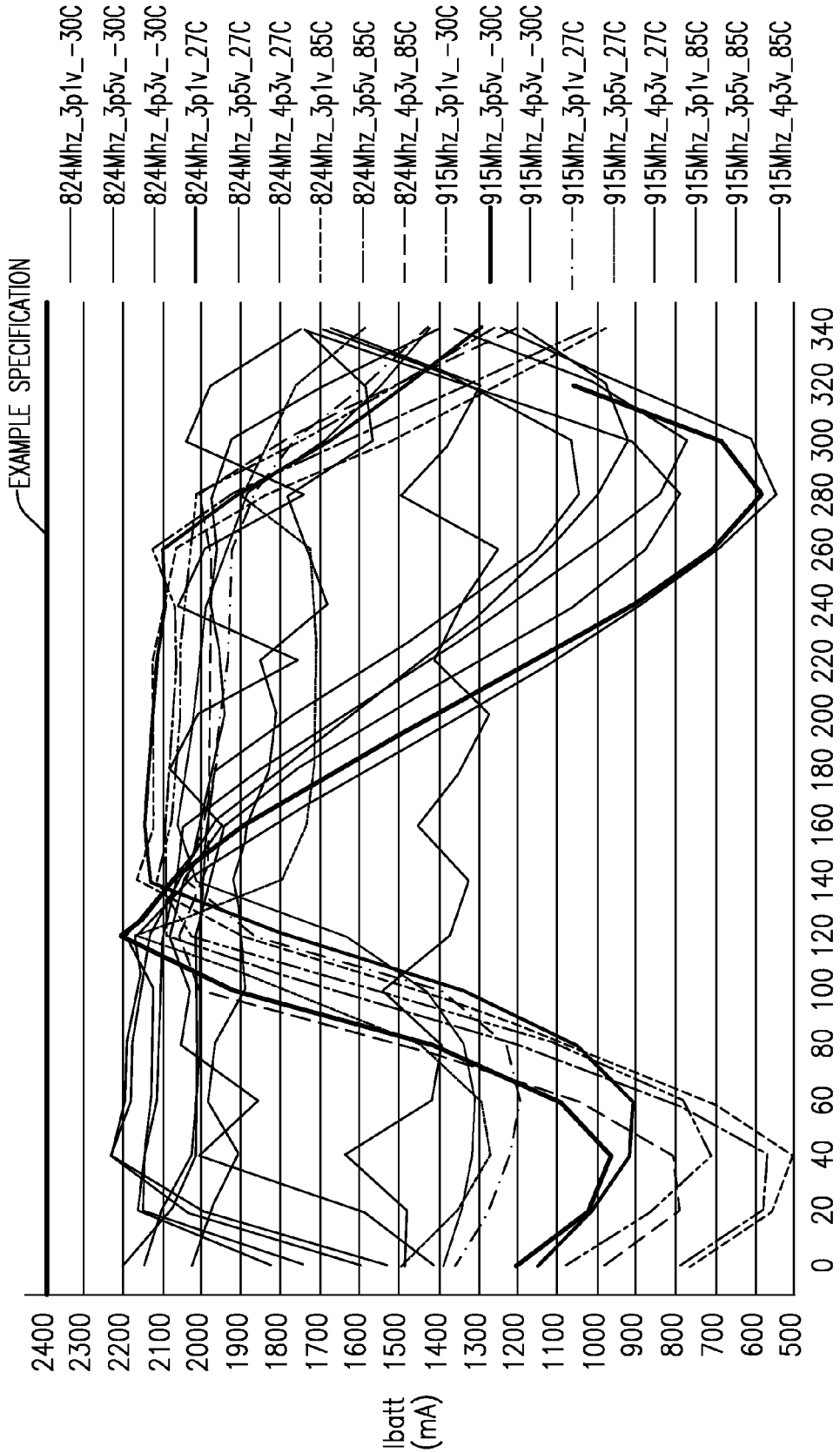
FIG. 10 shows examples of improvements in performance that can be obtained by one or more features of the present disclosure.

FIG. 10 shows an example of performance that can be achieved by a clamping technique as described herein. The example shows plots of maximum current drawn from a battery (Ibatt) through the differential current steering circuit 154 ("Ibase_clamp" in FIG. 2) at different temperature and Vdd, and under what can be considered extreme conditions (e.g., VSWR of 20:1, maximum Vramp (e.g., 2.1V)). The various curves are plotted as functions of phase.

In FIG. 10, an example of maximum allowed specification of 2.4 A is shown. The various Ibatt curves are well below this specified value, with the highest value being approximately 2.25 A. Thus, one can see that the techniques as described herein can provide an effective clamping functionality under a wide range of conditions.

Figure 11:
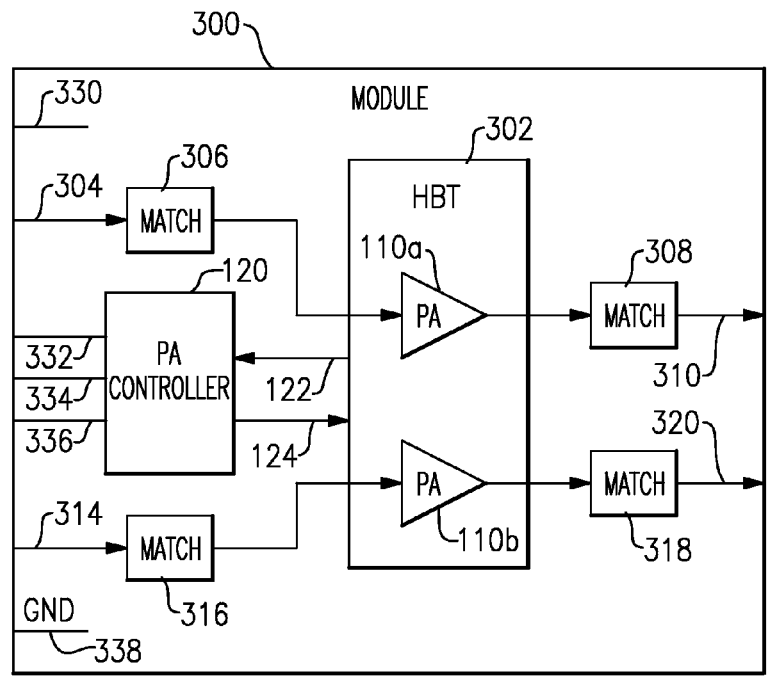
FIG. 11 shows that in some embodiments, one or more features of the present disclosure can be implemented in a module.
Figure 12:
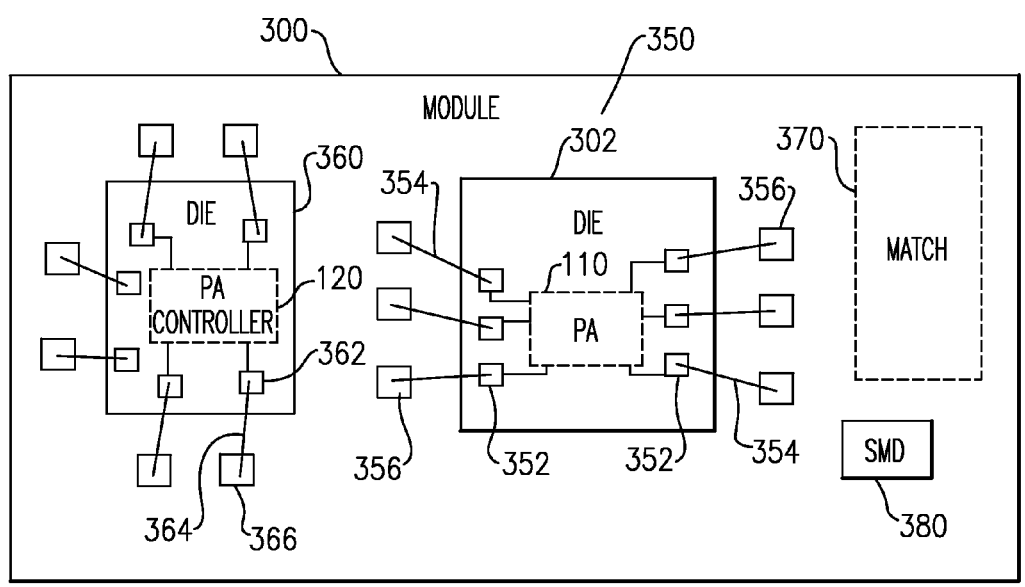
FIG. 12 shows that in some embodiments, the module of FIG. 11 can be a packaged module.

In some implementations, a device and/or a circuit having one or more features described herein can be included in a module. FIG. 11 schematically depicts an example module 300, and FIG. 12 shows an example where such a module can be implemented as a packaged module.

In FIG. 11, the example module 300 is shown to include a PA die 302 that includes a plurality of PAs (e.g., HBT PAs) 110. In some embodiments, such PAs can include base resistors for facilitating clamping of base bias voltages as described herein. The PAs 110 are shown to be interconnected with a PA controller 120 (arrows 122, 124). Such interconnections can include one or more features of control loops as described herein. In some embodiments, the PA controller 120 can be implemented in a die that is separate from the PA die 302. In some embodiments, the PA controller 120 can be implemented in the same die as the PA die 302.

The module 300 can include connection paths 332, 334, 336 that facilitate various operations of the PA controller 120. The connection paths 332, 334, 336 can include, for example, connections for providing various currents and/or voltages as described herein. The module 300 can also include other connection paths 330, 338 to facilitate, for example, grounding and other power and/or signals.

In the example module 300, the PA die 302 is shown to include two example PAs 110a, 110b. However, it will be understood that other numbers of PA channels can be implemented. In the context of the two PA channels, the first PA 110a is shown to be provided with an input signal through an input connection 304. Such an input can be passed through a matching circuit 306, and an output of the PA 110a can also be passed through a matching circuit 308. The matched output signal can be output from the module through an output connection 310. Similarly, the second PA 110b is shown to be provided with an input signal through an input connection 314. Such an input can be passed through a matching circuit 316, and an output of the PA 110b can also be passed through a matching circuit 318. The matched output signal can be output from the module through an output connection 320.

In the example packaged module 300 of FIG. 12, a die 302 having a power amplifier circuit 110 as described herein is shown to be mounted on a substrate 350. Such a die can be fabricated using a number of semiconductor process technologies, including the examples described herein. The die 302 can include a plurality of electrical contact pads 352 configured to allow formation of electrical connections 354 such as wirebonds between the die 302 and contact pads 356 formed on the packaging substrate 350.

A separate die 360 having a PA controller circuit 120 as described herein is shown to be mounted on the substrate 350. Such a die can be fabricated using a number of semiconductor process technologies, including the examples described herein. The die 360 can include a plurality of electrical contact pads 362 configured to allow formation of electrical connections 364 such as wirebonds between the die 360 and contact pads 366 formed on the packaging substrate 350.

The packaging substrate 350 can be configured to receive a plurality of components such as the dies 302, 360 and one or more SMDs (e.g., 380). In some embodiments, the packaging substrate 350 can include a laminate substrate.

In the example packaged module 300, a matching circuit 370 can be implemented on or within the substrate 350. Such a matching circuit 370 can include some or all of the match components 306, 308, 316, 318 described in reference to FIG. 11.

In some embodiments, the module 300 can also include one or more packaging structures to, for example, provide protection and facilitate easier handling of the module 300. Such a packaging structure can include an overmold formed over the packaging substrate 350 and dimensioned to substantially encapsulate the various circuits and components thereon.

It will be understood that although the module 300 is described in the context of wirebond-based electrical connections, one or more features of the present disclosure can also be implemented in other packaging configurations, including flip-chip configurations.

Figure 13:
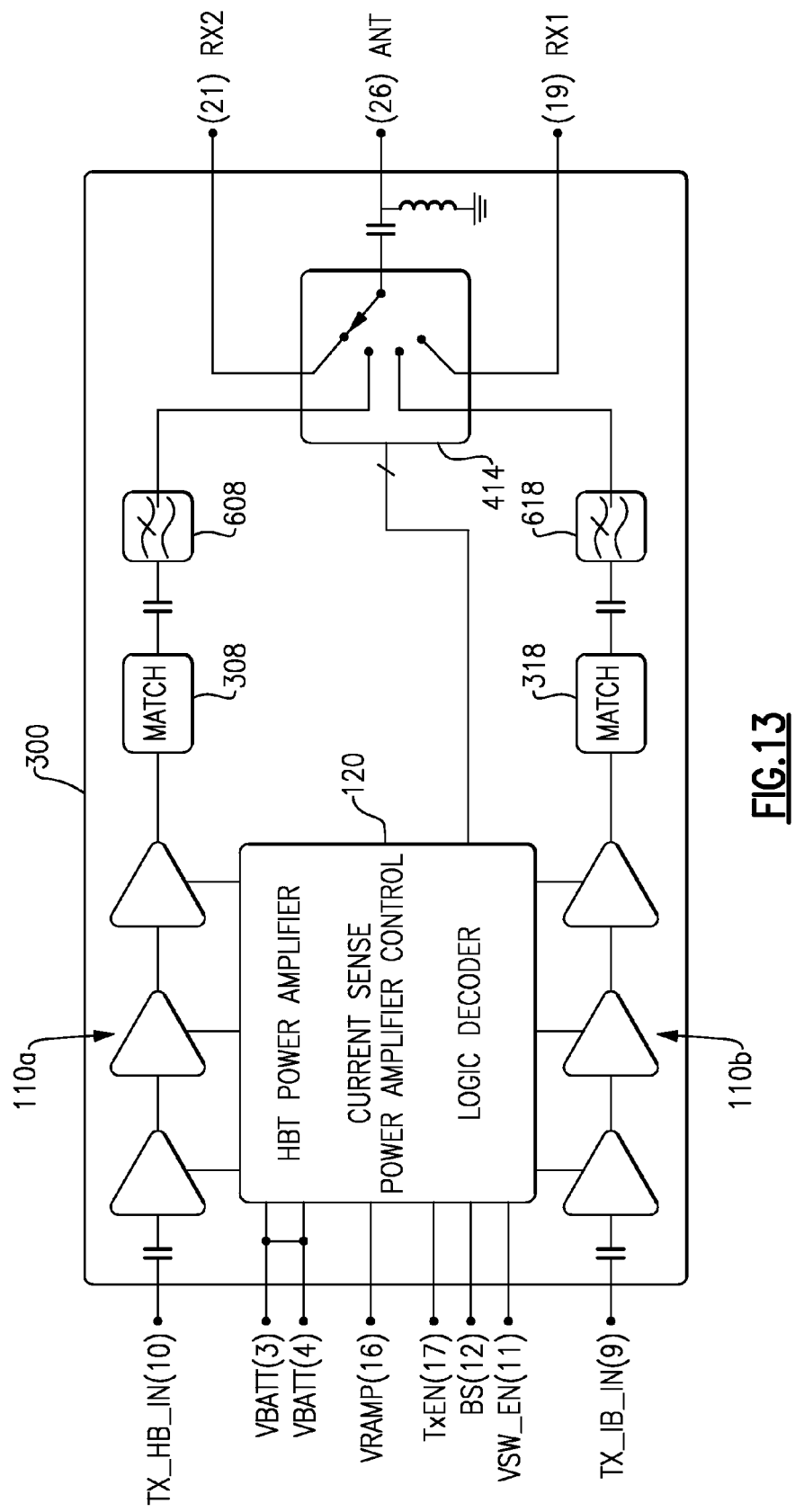
FIG. 13 shows that in some embodiments, the module of FIG. 9 can be implemented as an integrated front-end module.

FIG. 13 shows that in some embodiments, one or more features of the present disclosure can be implemented in a front-end module (FEM) 300 configured to facilitate transmit and receive functionalities. The example FEM 300 is depicted as providing transmit paths for high and low bands TX_HB and TX_LB. An RF signal associated with the high band can be received at an input pin TX_HB_IN and be provided to a DC-block capacitance, and then to a plurality of stages of a first PA 110a. Similarly, an RF signal associated with the low band can be received at an input pin TX_LB_IN and be provided to a DC-block capacitance, and then to a plurality of stages of a second PA 110b. The first and second Pas 110a, 110b are shown to be in communication with a control circuit 120 having one or more features as described herein. The control circuit 120 is shown to be in communication with a plurality of pins for receiving power as described herein (e.g., Vbatt, Vramp), as well as signals associated with various operations of the control circuit.

In FIG. 13, the control circuit 120 is further shown to provide a control signal to a switch circuit 414 configured to provide various switching functionalities. For example, TX/RX and band selection switching functionalities can be provided by the switch circuit 414.

In FIG. 13, the amplified RF signal from the first PA 110a is shown to be routed to the switch circuit 414 through, for example, an output matching circuit 308, a DC-block capacitance, and a filter 608. Similarly, the amplified RF signal from the second PA 110b is shown to be routed to the switch circuit 414 through, for example, an output matching circuit 318, a DC-block capacitance, and a filter 618.

In some embodiments, a front-end module such as the example of FIG. 13 can be configured to provide integrated power amplifier control implemented in a low profile, compact form factor for quad-band cellular handsets capable of operating in, for example, GSM850/GSM900 and DCS1800/PCS1900 bands. Such a module can be configured to provide a substantially complete transmit VCO-to-antenna functionality and antenna-to-receive SAW filter functionality. The example FEM of FIG. 13 can also be configured to support Class 12 General Packet Radio Service (GPRS) multi-slot operation and EDGE downlink.

In some implementations, a device and/or a circuit having one or more features described herein can be included in an RF device such as a wireless device. Such a device and/or a circuit can be implemented directly in the wireless device, in a modular form as described herein, or in some combination thereof. In some embodiments, such a wireless device can include, for example, a cellular phone, a smart-phone, a handheld wireless device with or without phone functionality, a wireless tablet, etc.

Figure 14:
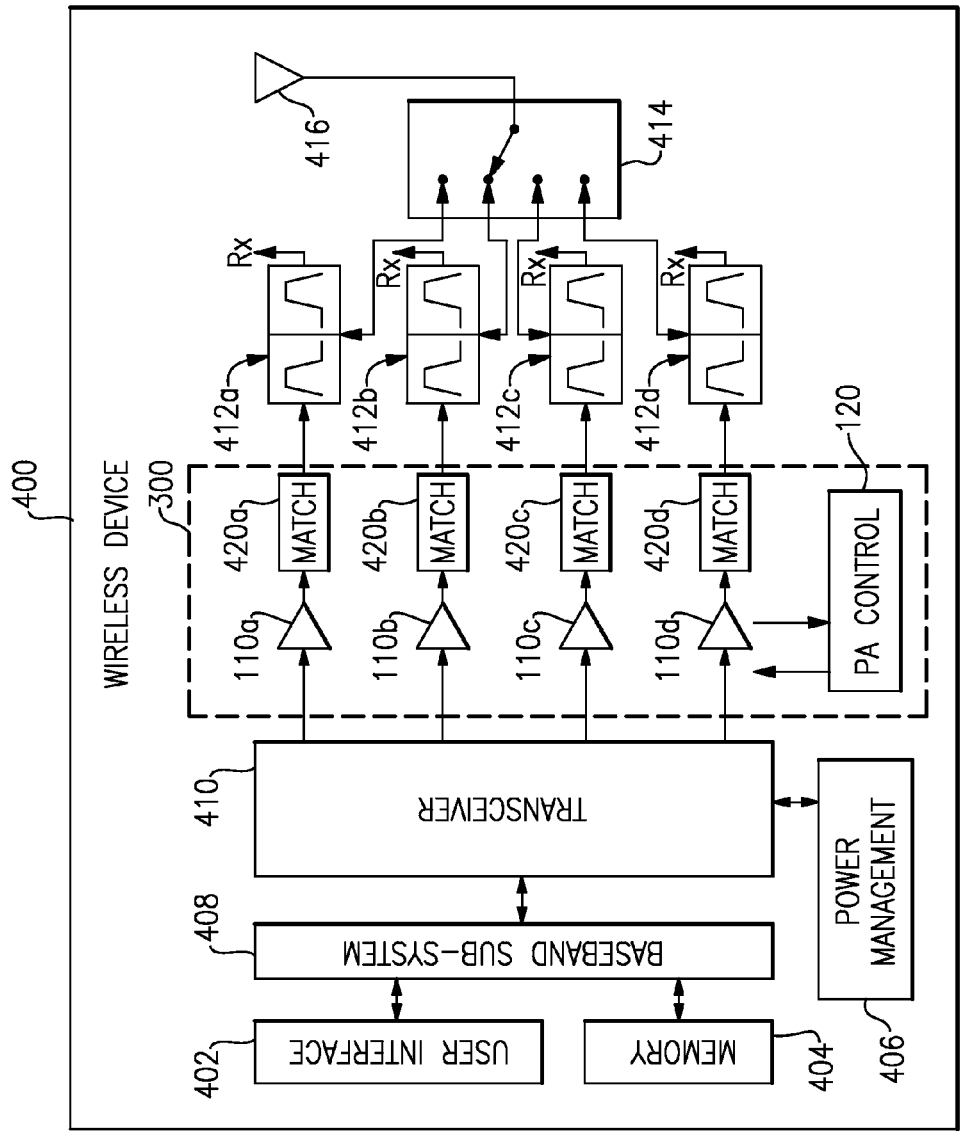
FIG. 14 shows that in some embodiments, one or more features of the present disclosure can be implemented in a wireless device such as a cellular phone.

FIG. 14 schematically depicts an example wireless device 400 having one or more advantageous features described herein. In the context of a control circuit for a PA, one or more PAs 110 as described herein are shown to be controlled by a PA control circuit 120. Such PAs and controller can facilitate, for example, multi-band operation of the wireless device 400. In embodiments where the PAs and their matching circuits are packaged into a module, such a module can be represented by a dashed box 300.

The PAs 110 can receive their respective RF signals from a transceiver 410 that can be configured and operated in known manners to generate RF signals to be amplified and transmitted, and to process received signals. The transceiver 410 is shown to interact with a baseband sub-system 408 that is configured to provide conversion between data and/or voice signals suitable for a user and RF signals suitable for the transceiver 410. The transceiver 410 is also shown to be connected to a power management component 406 that is configured to manage power for the operation of the wireless device. Such power management can also control operations of the baseband sub-system 408 and the module 300.

The baseband sub-system 408 is shown to be connected to a user interface 402 to facilitate various input and output of voice and/or data provided to and received from the user. The baseband sub-system 408 can also be connected to a memory 404 that is configured to store data and/or instructions to facilitate the operation of the wireless device, and/or to provide storage of information for the user.

In the example wireless device 400, outputs of the PAs 110 are shown to be matched (via match circuits 420) and routed to an antenna 416 via their respective duplexers 412a-412d and a band-selection switch 414. The band-selection switch 414 can include, for example, a single-pole-multiple-throw (e.g., SP4T) switch to allow selection of an operating band (e.g., Band 2). In some embodiments, each duplexer 412 can allow transmit and receive operations to be performed simultaneously using a common antenna (e.g., 416). In FIG. 14, received signals are shown to be routed to "Rx" paths (not shown) that can include, for example, a low-noise amplifier (LNA).

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A radio-frequency power amplifier control circuit, comprising:
   a first circuit configured to generate a replica base current from a base current provided to a power amplifier (PA), the replica base current representative of a collector current of the PA scaled by a beta parameter;
   a second circuit configured to generate a beta-tracking reference current from a temperature-compensated voltage and a base resistance associated with the PA; and
   a current steering circuit configured to generate a proportional current based on the replica base current and the beta-tracking reference current.

2. The control circuit of claim 1 wherein the temperature-compensated voltage includes a temperature-compensated bandgap voltage.

3. The control circuit of claim 1 wherein the current steering circuit is configured to generate the proportional current under a selected condition based on the replica base current and the beta-tracking reference current.

4. The control circuit of claim 3 further comprising a PA base driver in communication with the current steering circuit to receive the proportional current.

5. The control circuit of claim 3 wherein the current steering circuit is configured to generate the proportional current by comparing a replica base voltage corresponding to the replica base current and a beta-tracking reference voltage corresponding to the beta-tracking reference current.

6. The control circuit of claim 5 wherein each of the replica base voltage and the beta-tracking reference voltage is generated by providing the respective current into a matched resistor.

7. The control circuit of claim 5 wherein the selected condition based on the replica base current and the beta-tracking reference current includes the replica base voltage exceeding the beta-tracking reference voltage.

8. The control circuit of claim 1 wherein the base current is measured by a finger sensor.

9. The control circuit of claim 8 wherein the finger sensor is part of a control loop that is configured to generate an error current based on comparison of the base current and a ramp current.

10. The control circuit of claim 9 wherein the comparison of the base current and the ramp current is performed in a current-mode.

11. The control circuit of claim 10 wherein the error current is obtained by subtracting the base current from the ramp current.

12. The control circuit of claim 10 wherein the control loop further includes a trans-impedance amplifier configured to amplify the error current.

13. The control circuit of claim 1 wherein the power amplifier includes a gallium arsenide (GaAs) heterojunction bipolar transistor (HBT) power amplifier.

14. The control circuit of claim 1 further comprising a pre-charging system configured to pre-charge a selected node of the control circuit.

15. The control circuit of claim 14 wherein the pre-charging system including a sensor circuit configured to generate a control signal based on comparison of a base voltage of the PA and a reference voltage selected to be lower than a threshold voltage of the PA, the pre-charging system further including an actuator circuit in communication with the sensor circuit, the actuator circuit configured to receive the control signal from the sensor circuit, the actuator circuit further configured to enable or disable, based on the control signal, a pre-charge current for pre-charging the selected node of the control circuit.

16. A radio-frequency (RF) module comprising:
a packaging substrate configured to receive a plurality of components;
a power amplifier (PA) disposed over the packaging substrate;
a control circuit disposed over the packaging substrate and interconnected to the power amplifier, the control circuit including a first circuit configured to generate a replica base current from a base current provided to the PA, the replica base current representative of a collector current of the PA scaled by a beta parameter, the control circuit further including a second circuit configured to generate a beta-tracking reference current from a temperature-compensated voltage and a base resistance associated with the PA, the control circuit further including a current steering circuit configured to generate a proportional current based on the replica base current and the beta-tracking reference current; and
a plurality of connectors configured to provide electrical connections between the power amplifier, the control circuit, and the packaging substrate.

17. The RF module of claim 16 wherein the power amplifier is disposed on a first die and the control circuit is disposed on a second die, each of the first die and the second die being mounted on the packaging substrate.

18. A radio-frequency (RF) device comprising:
a transceiver configured to generate an RF signal;
a power amplifier (PA) in communication with the transceiver, the PA configured to amplify the RF signal;
a control circuit in communication with the PA, the control circuit including a first circuit configured to generate a replica base current from a base current provided to the PA, the replica base current representative of a collector current of the PA scaled by a beta parameter, the control circuit further including a second circuit configured to generate a beta-tracking reference current from a temperature-compensated voltage and a base resistance associated with the PA, the control circuit further including a current steering circuit configured to generate a proportional current based on the replica base current and the beta-tracking reference current; and
an antenna in communication with the PA, the antenna configured to facilitate transmission of the amplified RF signal.

19. The RF device of claim 18 wherein the RF device includes a wireless device.

20. The RF device of claim 19 wherein the wireless device is a cellular phone.

* * * * *